United States Patent [19]

Manktelow et al.

[11] 4,395,663
[45] Jul. 26, 1983

[54] CIRCUIT AND METHOD OF LINEARITY CORRECTION FOR CRT DEFLECTION CIRCUITS

[75] Inventors: Gerald Manktelow, Austin, Tex.; Kenneth T. Wolff, Medway, Mass.

[73] Assignee: Data General Corporation, Westboro, Mass.

[21] Appl. No.: 213,265

[22] Filed: Dec. 5, 1980

[51] Int. Cl.³ .................... H01J 29/70; H01J 29/76
[52] U.S. Cl. .................................. 315/403; 315/387
[58] Field of Search ............... 315/403, 387, 388, 389, 315/370, 384, 385, 399, 408, 409, 410; 307/261, 268; 331/173; 328/22, 27

[56] References Cited

U.S. PATENT DOCUMENTS

| | | | |
|---|---|---|---|
| 2,954,501 | 9/1960 | Pfeiffer | 315/384 |
| 3,501,671 | 3/1970 | Buechel | 315/403 |
| 3,562,557 | 2/1971 | Gates | 315/384 |
| 3,662,286 | 5/1972 | Krupa | 331/173 |
| 3,821,652 | 6/1974 | Wiebe et al. | 307/261 |
| 3,983,452 | 9/1976 | Bazin | 315/403 |
| 3,991,345 | 11/1976 | Jaspers | 315/389 |

Primary Examiner—Theodore M. Blum
Attorney, Agent, or Firm—Robert Dulaney

[57] ABSTRACT

Electronic apparatus and method is disclosed for generating a linearity correction signal for use in or with a CRT electron beam deflection circuit. In a preferred embodiment, transistor is used to vary the parameters of a multiple feedback infinite gain bandpass filter such that the filter is essentially on the point of oscillation during trace, but is highly damped during retrace.

10 Claims, 4 Drawing Figures

CIRCUIT AND METHOD OF LINEARITY CORRECTION FOR CRT DEFLECTION CIRCUITS

BACKGROUND OF THE INVENTION

1. Field of the Invention

The present invention relates generally to cathode ray tube (CRT) displays and particularly to a circuit and method for generating electron beam deflection signals.

2. Description of the Prior Art

The image on a CRT is generated by using an electron beam to stimulate selected areas of a phosphorescent material located on the inside of the CRT screen. The scanning of the CRT face is accomplished by deflecting the electron beam relatively rapidly in one direction, usually horizontal, and relatively slowly in a second direction, usually vertical. Typically, the horizontal movement of the yoke is independent of vertical movement.

The phosphorescent material on the screen is continuous, but because of the manner in which the beam moves, the screen can be considered to consist of a large number of generally horizontal, parallel "raster lines" or lines of displayed information. As the beam scans along a raster line, the information about the level of stimulation to be given a particular area on the raster line is updated at fixed intervals in accordance with a clock pulse from the CRT timing unit. The electron beam normally performs 50 or 60 "frames" or complete scans of the CRT screen per second, depending on the external electrical power available. From the viewpoint of an observer facing the screen, the beam begins a frame at the left side of the top raster line of the CRT and moves generally horizontally along the line to the right side of the screen. The beam then performs a retrace to the left side of the next lower raster line and again begins to scan horizontally to the right. This continues until the beam reaches the right side of the lowest raster line, at which time a vertical retrace is performed during which the beam moves back to the beginning of the top raster line to begin the next frame.

The yoke, which causes the deflection of the video beam, is usually driven by horizontal and vertical deflection current signals. Because the CRT screen is substantially flat and because the beam is deflected through an angle, distortion will result in the CRT image if the deflection signals to the yoke are driven with a current ramp alone. The current signals to the yoke must be modified or adjusted such that the deflection rate of the beam varies in a manner that results in the beam moving along the CRT face at a substantially constant speed during a scan. Because the horizontal deflection is much more rapid than the vertical deflection, a different connection technique has usually been used for vertical movement than for horizontal. A common approach in the prior art for vertical adjustment has been the use of a sine wave as a correction function. This approach is fairly accurate, but, as implemented in the prior art, has certain drawbacks and disadvantages.

The prior art technique of generating the sine wave reguires the use of at least two adjustments, and in some designs three, to try to achieve proper height, frequency, and linearity of the sine wave. The need for these adjustments increases the complexity and cost of the CRT circuitry, as well as requiring the time and effort of the personnel who must attempt to "fine tune" the output. Also, in the prior art, the characters at the top and bottom of the screen cannot be made perfectly symmetrical and therefore will be of differing sizes. This can degrade the appearance of the CRT image.

The present invention relates to a novel circuit and method for generating the sine wave correction function which is free of the above noted problems.

SUMMARY OF THE INVENTION

The present invention relates to apparatus and method for generating CRT electron beam deflection signals. A circuit for implementing the invention includes apparatus for generating deflection signals during scan, apparatus for generating deflection signals during retrace and apparatus for alternating the source of the deflection signals between the scan apparatus and the retrace apparatus.

It is a feature of the present invention that the apparatus for alternating between sources is responsive to an input signal indicating whether scan or retrace is commanded.

It is a further feature that the apparatus for alternating includes a transistor, a current source and logic structure which controls the interconnection of the transistor and the current source.

It is yet another feature that the scan apparatus is an active bandpass filter designed to be substantially on the point of oscillation and the retrace apparatus is an active bandpass filter designed to be in a region of high stability.

It is an advantage of the present invention that the complexity and cost of the CRT circuitry can be reduced since no post manufacturing adjustment apparatus is required to achieve proper height, frequency and linearity of the CRT image.

It is another advantage of the present invention that the symmetry of the images at the top and bottom of the CRT screen is enhanced.

Other features and advantages of the present invention will be understood by those of ordinary skill in the art after referring to the detailed description of preferred embodiment and drawings wherein:

DESCRIPTION OF THE PREFERRED EMBODIMENT

Introduction

Figure 1:
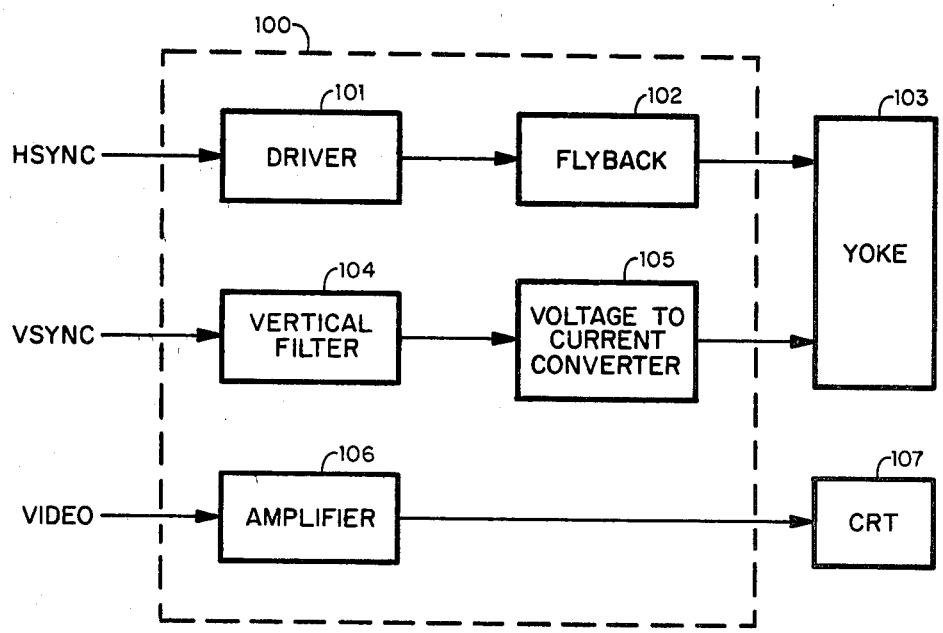
FIG. 1 is a block diagram showing major functional areas of a display monitor.

Referring to FIG. 1, major functional areas of display monitor circuitry 100 are shown. Driver 101 receives horizontal synchronization signal HSYNC from a line rate counter (not shown). Output of driver 101 is connected to flyback 102 which generates the horizontal drive signal to yoke 103. Vertical synchronization signal VSYNC is supplied to vertical filter 104 from a frame rate counter (not shown). Vertical filter 104 provides a time variable output voltage to voltage-to-current converter 105, which generates the vertical drive signal to yoke 103. Finally, the video signal is provided to amplifier 106 which provides it in turn to CRT 107 for display.

Figure 2:
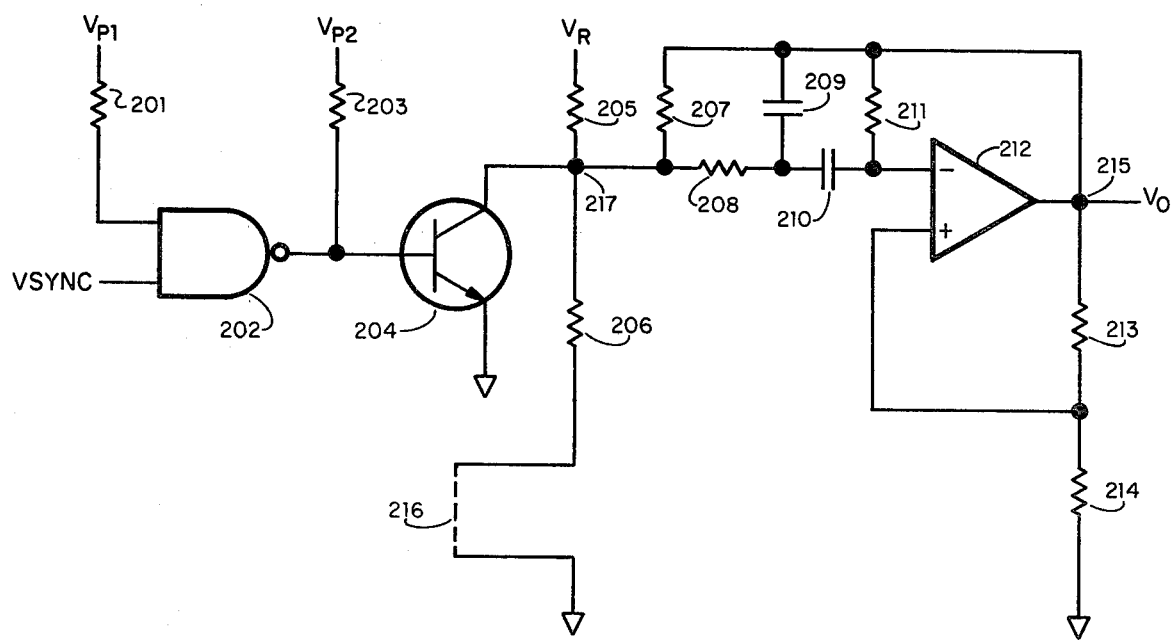
FIG. 2 is an illustrative embodiment of the present invention.

Filter 104, an illustrative embodiment of which is shown in FIG. 2, utilizes a time varying active filter to generate the sine wave correction function. The parameters of filter 104 are varied by a switching transistor such that the filter is highly damped during CRT vertical retrace, but is on the point of oscillation during trace.

Interconnection

Referring to FIG. 2, a preferred embodiment of filter 104 is depicted. One of the inputs to NAND gate 202 (for example, a 74S38N) is connected to positive voltage source VP1 (for example, 5 volts) through pullup resistor 201 (for example, 1 K ohms). The other input of gate 202 is connected to input signal VSYNC. The output of gate 202 is connected to the base of transistor 204 (for example, a 2N4123) and to positive voltage source VP2 (for example 5 volts) through pullup resistor 203 (for example, 270 ohms).

The collector of transistor 204 is coupled at junction 217 to positive voltage source VR (for example, 60 volts) through resistor 204 (for example, 16.9 K ohms) and, if external power is 50 hz rather than 60 hz, to ground through resistor 206 (for example, 3.32 K ohms) and jumper 216. The collector of transistor 204 is further coupled at junction 217 to resistor 208 (for example, 3.01 K ohms). In series with resistor 208 is capacitor 210 (for example, 0.33 microfarads), which is in turn connected to the negative input of op amp 212 (for example, a TL082CP). Resistor 207 (for example, 1 K ohms) is disposed between junction 217 and junction 215 at the output of op amp 212. Capacitor 209 (for example, 0.33 microfarads) is disposed between junction 215 and a point between resistor 20 and capacitor 210. Resistor 211 (for example, 750 K ohms) is connected between junction 215 and the negative input of op amp 212. Junction 215 is connected to ground through resistors 213 (for example, 604 ohms) and 214 (for example, 4.7 ohms). The positive input of op amp 212 is connected to a point between resistors 213 and 214. Finally, junction 215 is connected to output Vo.

Operation

Figure 3:
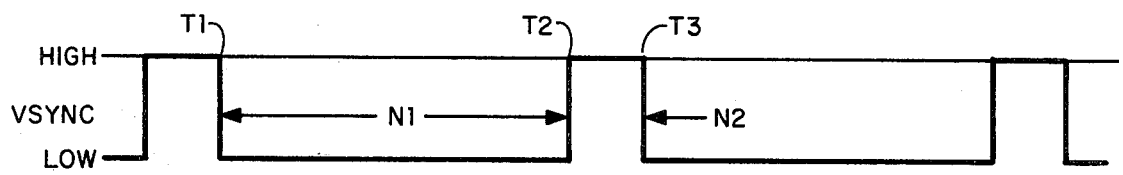
FIGS. 3a and 3b are illustrations of input and output waveforms.

Referring to FIG. 3, the VSYNC waveform applied to NAND gate 202 is represented. VSYNC low means that a vertical trace is underway while VSYNC high indicates retrace. At time T1, VSYNC goes low and stays low for a period equal to N1 horizontal scan cycles, which represents the time required for the beam to deflect vertically from the top raster line to the lowest raster line. At time T2, VSYNC goes high for N2 horizontal scan cycles, which represents the time for the beam to complete a vertical retrace. At time T3, VSYNC again goes low and another vertical scan/retrace cycle begins.

Referring now to FIG. 2, NAND gate 202 is coupled to voltage source VP2 and transistor 204 such that voltage source VP2 is seen by the base of transistor 204 only if both inputs to gate 202 are high. Therefore, when VSYNC goes low, the output of gate 202 is high and VP2 saturates transistor 204, thereby allowing current to flow through the transistor to ground. This will eliminate any effect of VR on output voltage Vo.

When VSYNC goes high, the output of NAND gate 202 goes low, thereby "turning off" transistor 204. Transistor 204 now provides a high resistance and allows the portion of the circuit to the right of junction 217 to see voltage source VR. In this manner, voltage source VR affects output voltage Vo during retrace, i.e., VSYNC high, but not during scan, i.e., VSYNC low.

The circuit shown to the right of junction 217 in FIG. 2 is an active filter implemented in a multiple feedback infinite gain bandpass configuration. At the time scan begins, i.e. when VSYNC goes low, capacitors 209 and 210 have charges which were acquired during the prior retrace. A current begins to flow away from the negative input of op amp 212. Because of the characteristics of op amps, this tends to pull Vo to a more positive value. In this embodiment, positive feedback to op amp 212 is used to raise the Q of the filter. By proper selection of resistors 208, 211, 213 and 214 and capacitors 209 and 210, the filter can be designed to operate substantially on the point of sinusoidal oscillation. Because of the bandpass configuration having positive feedback, the sinusoidal variation in output voltage Vo during scan, i.e., when unaffected by voltage source VR, can be made symmetrical about the zero point. This is a very desirable feature in CRT displays because it yields vertical symmetry of characters displayed on the CRT screen.

When retrace begins, i.e., when VSYNC goes high, the output of NAND gate 202 goes low. This "turns off" transistor 204, thereby allowing VR to dump energy into the circuit. Feedback resistor 207, which has no effect on filter operation during trace, now injects negative feedback into the filter. This results in output voltage Vo being damped and driven negative by VR at a rate much greater than it was driven positive during vertical scanning. During the retrace, the energy which VR puts into the filter creates charges in capacitors 209 and 210. These capacitor charges, as mentioned above, drive the filter during scan. The negative feedback during retrace changes the characteristics of the circuit from essentially an oscillator, as it is during trace, to one of long term stability.

Figure 3A:
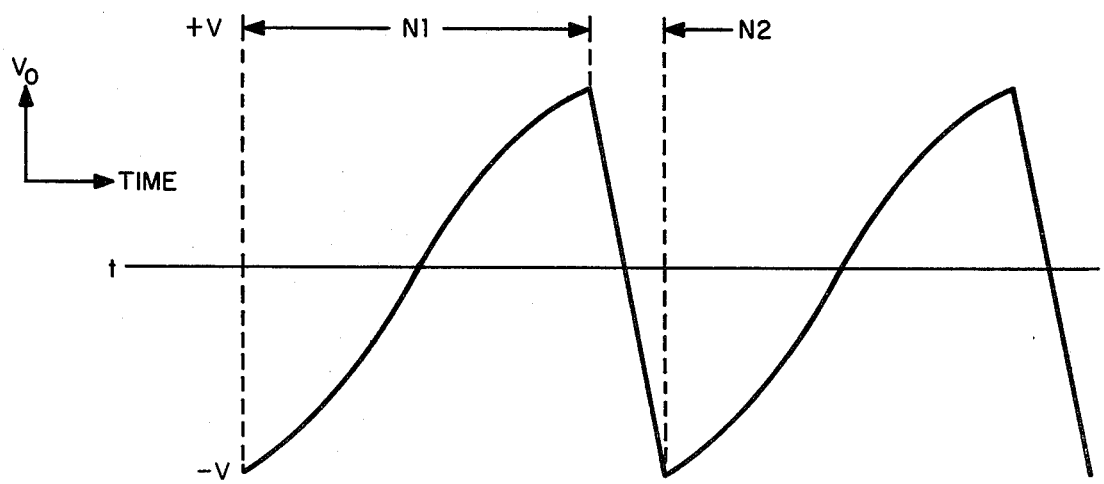

Referring to FIG. 3a, the variation in output voltage Vo is illustrated. At the start of a vertical scan, for example T1, output voltage Vo has a negative value which corresponds to maximum upward deflection of the beam. Following a sinusoidal path Vo moves to a positive value equal to maximum downward deflection of the beam. At T2, retrace begins and Vo starts to return to the initial negative value. Output voltage Vo follows a substantially straight line path during retrace because of the damping effect of the increased negative feedback when voltage source VR is in the circuit. At time T3, voltage Vo has been driven to the negative voltage of T1. VSYNC goes low, transistor 202 turns on, and the scan/retrace cycle begins again.

To provide the correction needed to achieve substantial elimination of geometric effects, the output correction function needs to be only a fractional part of a complete sine wave period. The amount of the sine wave that is required at the output is a function of the geometry of the CRT design and is controlled by the ratio of the frequency at which the circuit is driven and the natural frequency of the filter. By increasing the natural frequency of the filter, more of a complete sine wave will occur during the trace time. Conversely, by decreasing the frequency of the filter, less of a complete sine wave will occur. Therefore, by proper selection of the filter and feedback components, a near perfect sine wave output Vo, of the appropriate frequency and substantially symmetrical about zero, can be developed.

When external CRT electrical power is 50 hz, rather than 60 hz, the CRT screen is scanned only 50 times per second. The frame time must, therefore, be increased from one-sixtieth of a second to one-fiftieth of a second. In adjusting the frame time, it is desirable to keep the scan time fixed. In the illustrative embodiment shown in FIG. 2, this adjustment is accomplished with jumper 216. When jumper 216 is connected, voltage source VR is given another path to ground. This reduces the magnitude of the negative feedback seen by op amp 212 during retrace, but has no effect during scan because, as discussed above, voltage source VR is essentially removed from the circuit during scan by transistor 204. The smaller negative feedback results in a larger period of time being required to accomplish retrace. Therefore, referring to FIG. 3, with jumper 216 connected, scan time, for example T1 to T2, is the same as in the 60 hz case, but retrace time, for example T2 to T3, is enlarged to make total frame time, for example T1 to T3, equal to one-fiftieth of second.

The invention may be embodied in yet other specific forms without departing from the spirit or essential characteristics thereof. For example, the switched transfer function of this filter could be synthesized by many types of active filters or by a passive switched RLC circuit. The present embodiments are therefore to be considered in all respects as illustrative and not restrictive. The scope of the invention is indicated by the appended claims rather than by the foregoing description, and all changes which come within the meaning and range of equivalency of the claims are therefore intended to embraced therein.

We claim:

1. Electrical apparatus for generating a deflection signal for the electron beam in a raster scan CRT, said apparatus comprising:
    active bandpass filter means for generating a first deflection signal waveform;
    means for generating a second deflection signal waveform; and
    means for alternating between said filter and said second waveform means, such that said filter generates the deflection signals for said electron beam during scan and said second waveform means generates the deflection signals for said electron beam during retrace.

2. The apparatus as recited in claim 1, wherein said alternating means is responsive to an input signal indicating whether scan or retrace is commanded.

3. The apparatus as recited in claim 1, wherein said active bandpass filter includes an operational amplifier having both negative and positive feedback circuitry.

4. The apparatus as recited in claim 1, wherein said active bandpass filter is designed to be substantially on the point of oscillation, such that the deflection waveform generated by said filter is substantially sinusoidal in shape.

5. The apparatus as recited in claim 1, wherein said second deflection signal means comprises said active bandpass filter and a voltage source, said voltage source being connected to said filter such that negative feedback is increased.

6. The apparatus as recited in claim 5, wherein said second means is designed to be in a region of high stability, such that the deflection signal generated by said second means is a substantially straight line.

7. A method for generating a deflection signal for the electron beam in a raster scan CRT using a deflection circuit, said method comprising the steps of:
    (a) supplying a voltage to an active bandpass filter during retrace such that the output of said filter is a substantially straight line;
    (b) removing said voltage from said filter at the end of retrace such that the output of said filter is substantially sinusoidal during scan; and
    (c) repeating steps (a) and (b) for each scan cycle.

8. Electrical apparatus for generating a deflection signal for the electron beam in a raster scan CRT, said apparatus comprising:
    an active bandpass filter;
    a voltage source; and
    means connected to said voltage source for supplying the voltage from said voltage source to said filter during retrace and removing said voltage from said filter during scan whereby the parameters of said filter are varied.

9. The apparatus of claim 8 wherein said filter includes an operational amplifier having both negative and positive feedback circuitry.

10. Electrical apparatus for generating an electron beam deflection signal in a raster scan CRT, said apparatus comprising:
    means for generating a substantially sinusoidal deflection signal waveform; and
    means for damping the output of said waveform generating means during retrace such that the output of said apparatus during retrace is a substantially straight line.

* * * * *